(12) United States Patent
Kim et al.

(10) Patent No.: US 9,920,450 B2
(45) Date of Patent: Mar. 20, 2018

(54) SILICON CARBIDE POWDER, METHOD FOR MANUFACTURING THE SAME AND METHOD FOR GROWING SINGLE CRYSTAL

(71) Applicant: LG INNOTEK CO., LTD., Seoul (KR)

(72) Inventors: Byung Sook Kim, Seoul (KR); Bum Sup Kim, Seoul (KR); Kyoung Seok Min, Seoul (KR); Dong Geun Shin, Seoul (KR); Seo Yong Ha, Seoul (KR); Jung Eun Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 160 days.

(21) Appl. No.: 14/369,099

(22) PCT Filed: Dec. 14, 2012

(86) PCT No.: PCT/KR2012/010962
§ 371 (c)(1),
(2) Date: Jun. 26, 2014

(87) PCT Pub. No.: WO2013/100456
PCT Pub. Date: Jul. 4, 2013

(65) Prior Publication Data
US 2014/0331917 A1    Nov. 13, 2014

(30) Foreign Application Priority Data
Dec. 26, 2011  (KR) ........................ 10-2011-0142885

(51) Int. Cl.
*C30B 23/00*  (2006.01)
*C30B 23/02*  (2006.01)
(Continued)

(52) U.S. Cl.
CPC .............. *C30B 23/02* (2013.01); *C01B 31/18* (2013.01); *C01B 31/36* (2013.01); *C30B 23/00* (2013.01);
(Continued)

(58) Field of Classification Search
CPC .......... C30B 23/00; C30B 29/36; C01B 31/36
See application file for complete search history.

(56) References Cited

U.S. PATENT DOCUMENTS 5,525,556 A * 6/1996 Dunmead .............. B82Y 30/00
                                            423/344
6,464,843 B1 * 10/2002 Wicker ................. H01J 37/321
                                             118/721
(Continued)

FOREIGN PATENT DOCUMENTS

| JP | 2000-178071 A | 6/2000 |
| KR | 10-0848810 B1 | 7/2008 |
| KR | 10-2011-0021523 A | 3/2011 |

OTHER PUBLICATIONS

International Search Report in International Application No. PCT/KR2012/010962, filed Dec. 14, 2012.

*Primary Examiner* — Matthew J Song
(74) *Attorney, Agent, or Firm* — Saliwanchik, Lloyd & Eisenschenk

(57) ABSTRACT

A silicon carbide powder according to the embodiment includes nitrogen having a concentration in a range of about 100 ppm to about 5000 ppm. A method for manufacturing silicon carbide powder according to the embodiment includes preparing a mixture by mixing a silicon source including silicon with a solid carbon source or a carbon source including an organic carbon compound; heating the mixture; cooling the mixture; and supplying a nitrogen-based gas into the mixture.

5 Claims, 1 Drawing Sheet

(51) Int. Cl.
    *C01B 31/36*    (2006.01)
    *C30B 29/36*    (2006.01)
    *C01B 31/18*    (2006.01)
    *H01L 29/16*    (2006.01)

(52) U.S. Cl.
    CPC .......... *C30B 29/36* (2013.01); *H01L 29/1608* (2013.01); *Y10T 428/2982* (2015.01)

(56) References Cited

U.S. PATENT DOCUMENTS

| | | | |
|---|---|---|---|
| 2001/0024704 A1* | 9/2001 | Otsuki | B08B 3/12 428/34.7 |
| 2002/0005213 A1* | 1/2002 | Otsuki | B08B 3/12 134/26 |
| 2002/0104478 A1* | 8/2002 | Oguri | C30B 23/00 117/104 |
| 2003/0033976 A1* | 2/2003 | Coleman | C30B 23/00 117/108 |
| 2004/0161376 A1* | 8/2004 | Otsuki | C04B 35/575 423/346 |
| 2006/0046920 A1* | 3/2006 | Odaka | C04B 35/565 501/88 |
| 2007/0082460 A1* | 4/2007 | Ishida | B24B 9/065 438/455 |
| 2009/0111678 A1 | 4/2009 | Haerle et al. | |

* cited by examiner

[Fig. 1]
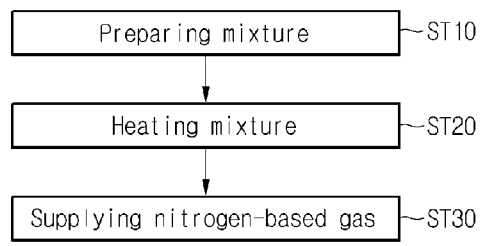
[Fig. 2]
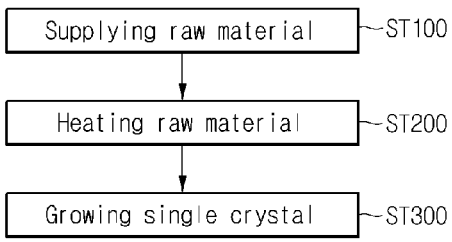
[Fig. 3]
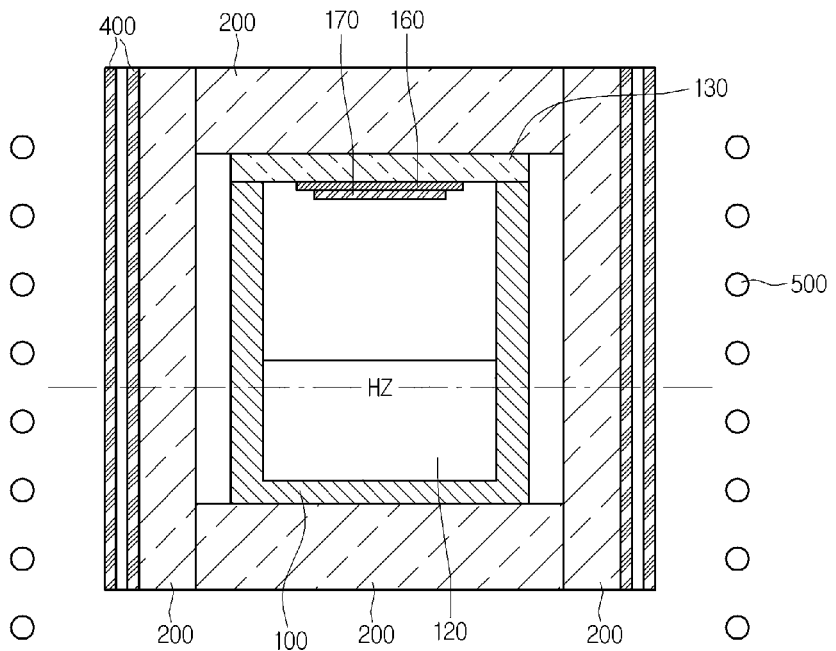

SILICON CARBIDE POWDER, METHOD FOR MANUFACTURING THE SAME AND METHOD FOR GROWING SINGLE CRYSTAL

CROSS-REFERENCE TO RELATED APPLICATIONS

This application is the U.S. national stage application of International Patent Application No. PCT/KR2012/010962, filed Dec. 14, 2012, which claims priority to Korean Application No. 10-2011-0142885, filed Dec. 26, 2011, the disclosures of each of which are incorporated herein by reference in their entirety.

TECHNICAL FIELD

The embodiment relates to silicon carbide powder, a method for manufacturing the same and a method for growing a single crystal.

BACKGROUND ART

Recently, silicon carbide has been used in various electronic devices as a semi-conductor material for various purposes. In particular, the silicon carbide is very useful because the silicon carbide has the superior physical strength and high resistance against the chemical attack. In addition, the silicon carbide represents the superior electronic characteristics, such as the high radiation hardness, relatively wide bandgap, high saturated electron drift velocity, high operating temperature, and high absorption and emission of quantum energy in the blue, violet and ultraviolet bands of a spectrum.

The silicon carbide can be fabricated by mixing and heating source materials, such as a silicon source and a carbon source. A scheme for fabricating the silicon carbide powder uses an Acheson scheme, a carbon-thermal reduction scheme, a liquid polymer thermal decomposition scheme, and a CVD (Chemical Vapor Deposition) scheme, which are generally known in the art. In particular, the liquid polymer thermal decomposition scheme or the carbon-thermal reduction scheme is used for synthesizing a high purity silicon carbide powder.

A silicon carbide single crystal may be grown through the apparatus for growing a silicon carbide single crystal, which uses the silicon carbide powder fabricated by the above fabricating scheme as a raw material. In a case of nitrogen used as a dopant when growing the silicon carbide single crystal, in general, an n-type SiC single crystal is fabricated by supplying nitrogen gas into the single crystal growing apparatus during the process of growing the single crystal.

However, when the n-type silicon carbide single crystal is fabricated, it is difficult to uniformly supply the nitrogen gas into the apparatus for growing silicon carbide single crystal at the high temperature. In addition, since a process step is added, the process efficiency is deteriorated and the process cost is increased.

Thus, when the n-type silicon carbide single crystal is fabricated, a new scheme which can grow the single crystal without supplying the nitrogen gas during the single crystal growing process is required.

DISCLOSURE OF INVENTION

Technical Problem

The embodiment provides silicon carbide powder capable of effectively improving doping concentration and doping uniformity when fabricating an n-type SiC single crystal, a method for manufacturing the same, and a method for growing a silicon carbide single crystal manufactured by using the silicon carbide powder.

Solution to Problem

A silicon carbide powder according to the embodiment includes nitrogen having a concentration in a range of about 100 ppm to about 5000 ppm.

A method for manufacturing silicon carbide powder according to the embodiment includes preparing a mixture by mixing a silicon source including a silicon with a carbon source including a solid carbon source or an organic carbon compound; heating the mixture; cooling the mixture; and supplying a nitrogen-based gas into the mixture.

A method for growing silicon carbide single crystal according to the embodiment includes supplying a raw material into a crucible; heating the crucible; and growing a silicon carbide single crystal on a seed fixed by a holder placed at an upper portion of the crucible by sublimating the raw material, wherein the raw material includes silicon carbide powder, and the silicon carbide powder includes nitrogen having a concentration in a range of about 100 ppm to about 5000 ppm.

Advantageous Effects of Invention

According to the method for manufacturing silicon carbide powder of the embodiment, the nitrogen-based gas is supplied during the manufacturing process, so that the silicon carbide powder including high-concentration nitrogen can be manufactured.

Thus, when the n-type silicon carbide single crystal is grown with the silicon carbide powder including the high-concentration nitrogen as a raw material, a process of supplying the nitrogen gas can be omitted, so that the process cost can be reduced and the process efficiency can be improved.

In addition, since the single crystal growing process proceeds with the silicon carbide powder including nitrogen as a raw material source, the nitrogen can be uniformly doped into the silicon carbide single crystal, so that the silicon carbide single crystal having the high quality can be grown.

BRIEF DESCRIPTION OF DRAWINGS

FIG. 1 is a flowchart showing a method for manufacturing silicon carbide powder according to the embodiment;

FIG. 2 is a flowchart showing a method for growing a single crystal according to the embodiment; and FIG. 3 is a view showing an apparatus for growing a single crystal according to the embodiment.

MODE FOR THE INVENTION

Hereinafter, the method for manufacturing silicon carbide according to the embodiment will be described in detail with reference to the accompanying drawings.

FIG. 1 is a flowchart showing a method for manufacturing silicon carbide powder according to the embodiment.

Referring to FIG. 1, the method for manufacturing silicon carbide powder according to the embodiment includes a step ST10 of preparing a mixture; a step ST20 of heating the mixture; and a step ST30 of supplying a nitrogen-based gas.

Hereinafter, each step of the method will be described in more detail.

In step ST10 of preparing the mixture, the silicon (Si) source and the carbon (C) source are prepared and mixed to form a mixture material.

The silicon source may include various materials capable of providing silicon. For instance, the silicon source may include silica sol, silicon dioxide, fine silica and quartz powder, but the embodiment is not limited thereto. For instance, an organic silicon compound including silicon may be used as the silicon source.

The carbon source may include a solid carbon source or an organic carbon compound.

The solid carbon source may include a carbon black, a carbon nano tube (CNT), or fullerene (C60).

The organic carbon compound may include at least one of phenol resin, franc resin, xylene resin, polyimide, polyurethane, polyacrylonitrile, polyvinyl alcohol, cellulose, sugar, pitch, and tar.

The carbon source and the silicon source may be mixed with each other through the wet mixing process using the solvent or the dry mixing process without using the solvent. According to the wet mixing process, the carbon source can be conglomerated with the silicon source, so that the productivity can be improved. In addition, according to the dry mixing process, the cost for the solvent can be saved, the pollution caused by the solvent can be prevented, and the carbonization process can be omitted, so that the process can be simplified.

The silicon source and the carbon source are mixed by using a ball mill or an attrition mill to recover mixture powder. The mixture powder can be recovered by filtering the mixture through a sieve.

The silicon source and the carbon source can be mixed in a predetermined mass ratio. For instance, a mole ratio of carbon included in the carbon source to silicon included in the silicon source (hereinafter, referred to as mole ratio of carbon to silicon) is in the range of about 1:1.5 to 1:3. If the mole ratio of carbon to silicon exceeds 3, the amount of carbon is so excessive that the amount of residual carbon, which does not participate in the reaction, is increased, lowering the recovery rate. In addition, if the mole ratio of carbon to silicon is less than 1.5, the amount of silicon is so excessive that the amount of residual silicon, which does not participate in the reaction, is increased, lowering the recovery rate. That is, the mole ratio of carbon to silicon must be determined by taking the recovery rate into consideration.

Since the silicon source is volatilized into a gas phase at the high temperature during the reaction, the mole ratio of carbon to silicon is set in the range of about 1.8 to about 2.7.

The silicon source is uniformly mixed with the carbon source to form the mixture.

In step ST20 of heating the mixture. In detail, the mixture is weighed in a graphite crucible and then the mixture is supplied and heated in a high-temperature reaction furnace, such as a graphite furnace. The process to form the silicon carbide powder may be classified into the carbonization process and the synthesis process.

In the carbonization process, the organic carbon compound is carbonized so that carbon is produced. The carbonization process is performed at the temperature in the range of about 600° C. to about 1200° C. In detail, the carbonization process is performed at the temperature in the range of about 800° C. to about 1100° C. If the solid carbon source is used as the carbon source, the carbonization process may be omitted.

Thereafter, the synthesis process is performed. In the synthesis process, the silicon source is reacted with the carbon source, so that the silicon carbide is formed through following reaction formulas 1 to 3.

$$SiO_2(s)+C(s) \rightarrow SiO(g)+CO(g) \quad \text{[Reaction formula 1]}$$

$$SiO(g)+2C(s) \rightarrow SiC(s)+CO(g) \quad \text{[Reaction formula 2]}$$

$$SiO_2(s)+3C(s) \rightarrow SiC(s)+2CO(g) \quad \text{[Reaction formula 3]}$$

In order to facilitate the above reaction, the heating temperature is set to 1300° C. or above. If the heating temperature is set in the range of 1300° C. to 1900° C., the fabricated silicon carbide may have the β type, which is the low-temperature stable phase. The silicon carbide having the β type consists of fine particles, so the strength of the silicon carbide can be improved. However, the embodiment is not limited thereto. For instance, if the heating temperature exceeds 1800° C., the silicon carbide may have the α type, which is the high-temperature stable phase. The synthesis process may be performed for about 1 hour to about 7 hours A grain growing process may be additionally performed after the synthesis process. The grain growing process may be performed at the temperature in the range of about 1800° C. to about 2300° C. Preferably, the grain growing process may be performed at the temperature in the range of about 2000° C. to about 2200° C. However, the grain growing process may proceed following the synthesis process, or may proceed as an additional process after the synthesis process and the cooling process. Further, when silicon carbide powder having a small grain size is fabricated, the grain growing process may be omitted. Preferably, the method for manufacturing silicon carbide powder according to the embodiment may further perform the grain growing process and the silicon carbide powder manufactured according to the embodiment may have a grain size of about 10 μm or more. More preferably, the silicon carbide powder manufactured according to the embodiment may have a grain size in the range of about 10 μm to 20 μm.

Next, in the step ST30 of supplying the nitrogen-based gas, after the heated reaction furnace, such as a graphite furnace, is cooled to a predetermined temperature, the nitrogen-based gas is supplied into the crucible. That is, the nitrogen-based gas may be supplied at the temperature lower than that of the step of heating the mixture. The nitrogen-based gas may include a nitrogen ($N_2$) gas and/or an ammonia ($NH_3$) gas. However, the embodiment is not limited thereto, and various gases may be included as well as nitrogen.

The nitrogen-based gas may be supplied at the temperature in the range of about 1300° C. to about 1900° C. Preferably, the nitrogen-based gas may be supplied at the temperature in the range of about 1400° C. to about 1800° C. As the nitrogen-based gas is supplied at the above temperature, the nitrogen concentration in the mixture may be easily controlled.

The nitrogen-based gas may be supplied at a rate in a range of about 5 l/min to about 500 l/min. Preferably, the nitrogen-based gas may be supplied at a rate in a range of about 20 l/min to about 100 l/min. If the nitrogen-based gas is supplied at the rate less than about 5 l/min or less, a desired nitrogen doping concentration may be not obtain when a single crystal is grown by using the silicon carbide powder as the raw material.

According to the method for manufacturing silicon carbide powder of the embodiment, the silicon carbide powder manufactured according to the method may include nitrogen having a concentration in a range of about 500 ppm to about 5000 ppm. Preferably, the silicon carbide powder may include nitrogen having a concentration in a range of about 500 ppm to about 2000 ppm.

Thus, an additional process of supplying a nitrogen gas may be omitted when the process of growing the n-type silicon carbide single crystal is performed by using the silicon carbide powder fabricated according to the method for manufacturing silicon carbide powder as a raw material. In addition, since the silicon carbide powder serving as the raw material source may be supplied simultaneously with the nitrogen, the n-type silicon carbide single crystal having a uniform nitrogen concentration may be grown.

Hereinafter, the embodiment will be described in more detail with reference to manufacture examples and comparative examples. The manufacture examples are illustrative proposes only and the embodiment is not limited thereto.

Manufacture Example 1

The fumed silica of 50 g and phenol resin of 63 g were mixed to prepare mixture 1. At this time, the average grain size of the fumed silica was about 50 nm and the residual rate of carbon in the phenol resin after the carbonization process was about 60%. In addition, the source material of 6 kg was supplied in the crucible of 500φ×100H.

Thereafter, the mixture was subject to the carbonization process at the temperature of about 850° C. for five hours while rising the temperature at the rate of 3° C./min, subject to the synthesis process at the temperature of about 1700° C. for three hours while rising the temperature at the rate of 5° C./min, and then subject to the grain growing process at the temperature of about 2100° C. for one hour while rising the temperature at the rate of 5° C./min, thereby forming silicon carbide powder. The nitrogen gas was supplied at the rate of 5 l/min for one hour at the temperature of 1400° C.

An argon (Ar) gas serving as a process gas is supplied in the reaction atmosphere during the carbonization and grain growing processes. The carbonization process was started at the initial vacuum degree of 5×12−2 Torr or less and continued by operating a rotary pump.

Manufacture Example 2

The silicon carbide powder was prepared under the same composition and same condition of manufacture example 1 except that the nitrogen gas was supplied for one hour at the rate of 10 L/min at the temperature of 1600.degree. C.

Manufacture Example 3

The silicon carbide powder was prepared under the same composition and same condition of manufacture example 1 except that the ammonia gas was supplied for one hour at the rate of 5 L/min at the temperature of 1600.degree. C.

Comparative Example 1

The silicon carbide powder was prepared under the same composition and same condition of manufacture example 1 except that the nitrogen-based gas, that is, a nitrogen gas or an ammonia gas was not supplied.

TABLE 1

| | Manufacture example 1 | Manufacture example 2 | Manufacture example 3 | Comparative example 1 |
|---|---|---|---|---|
| Nitrogen concentration (ppm) | 500 | 1200 | 960 | 80 |

Referring to Table 1, as compared with the comparison example, the nitrogen concentrations of the silicon carbide powders according to the manufacture examples 1 to 3 are higher than that of the comparison example. That is, the nitrogen concentrations of the manufacture examples 1 to 3 in which the nitrogen gas is supplied are higher than that by an impurity in the comparison example. Thus, the nitrogen-based gas that is, a nitrogen gas or an ammonia gas is supplied during the process of manufacturing silicon carbide powder, so that the nitrogen concentration of the silicon carbide powder may be increased.

Hereinafter, the method for growing a silicon carbide single crystal will be described with reference to FIGS. 2 and 3.

Referring to FIG. 2, the method for growing silicon carbide single crystal according to the embodiment includes a step ST100 of supplying a raw material; a heating step ST200; and a step ST300 of growing a single crystal.

Referring to FIG. 3, the apparatus for growing silicon carbide single crystal according to the embodiment includes a crucible 100, an upper cover 130, a seed holder 160, a thermal insulator 200, a quartz tube 400, and a heat generation induction part 500.

In the step ST100 of supplying a raw material, the raw material may be supplied into a material receiver of the crucible 100. The raw material 120 may include silicon and carbon. In more detail, the raw material 120 may include a silicon carbide compound. The crucible 100 may receive a raw material including silicon carbide (SiC) powder therein. Further, the silicon carbide powder may include nitrogen. Preferably, the silicon carbide powder may include nitrogen having a concentration in the range of 100 ppm to 5000 ppm. More preferably, the silicon carbide powder may include nitrogen having a concentration in the range of 500 ppm to 2000 ppm.

Then, in the step ST200 of heating a crucible and the step ST300 of growing a single crystal, the crucible 100 may be heated by the heat generation induction part 500. The heat generation induction part 500 is placed out of the crucible 100. For example, the heat generation induction part 500 may be a high-frequency induction coil. The crucible 100 may be heated as a high-frequency current flows through the high-frequency induction coil. That is, the raw material, which is received in the crucible 100, may be heated at the desired temperature.

The central area of the heat generation induction part 500, which is induction heated, is formed at a position lower than the central area of the crucible 100. Thus, the temperature gradient may be formed in the crucible 100 such that an upper portion and a low portion of the crucible 100 may have temperatures different from each other. That is, a hot zone (HZ), which is the center of the heat generation induction part 500, is located lower than the center of the crucible 100, so that the temperature of the low portion of the crucible 100 is higher than that of the upper portion of the crucible 100 about the hot zone (HZ). Due to the temperature gradient, the silicon carbide raw material is sublimated. Thus, the sublimated silicon carbide gas moves to the seed placed at the upper portion of the crucible, so that the silicon carbide single crystal may be growth.

The method for manufacturing a silicon carbide single crystal grows the single crystal by using the silicon carbide powder including a high-concentration of nitrogen as a raw material. Thus, the nitrogen doping concentration of the silicon carbide single crystal manufactured by the method for manufacturing a silicon carbide single crystal may be improved, and the n-type silicon carbide single crystal having a uniform concentration may be grown.

Hereinafter, the embodiment will be described in more detail with reference to manufacture examples and comparative examples. The manufacture examples are illustrative proposes only and the embodiment is not limited to the manufacture examples.

Manufacture Example 4

The silicon carbide powder manufactured according to manufacture example 2 was supplied into the crucible as a raw material and then the crucible was heated at the single crystal growing temperature, such that the silicon carbide single crystal was grown.

Comparative Example 2

The silicon carbide powder manufactured according to the comparison example 1 was supplied into the crucible as a raw material, the crucible was heated at the single crystal growing temperature, and then, the nitrogen gas was supplied at the rate of 5 5 l/min to grow a silicon carbide single crystal.

TABLE 2

|  | Manufacture example 4 | Comparative example 2 |
|---|---|---|
| Doping concentration (ppm) | $5 \times 10^{18}$ | $2 \times 10^{18}$ |

Referring to Table 2, the silicon carbide single crystal according to manufacture example 4 has a nitrogen doping concentration higher than that of comparative example 2. That is, a silicon carbide single crystal having a nitrogen concentration higher than that of an n-type SiC single crystal grown by separately supplying a nitrogen gas may be grown when the n-type silicon carbide single crystal is grown by using the silicon carbide powder having a high-concentration nitrogen as a raw material.

Thus, since the silicon carbide single crystal according to the embodiment may be formed without the process of separately supplying nitrogen and the silicon carbide single crystal may be grown by using the silicon carbide powder containing nitrogen, the n-type silicon carbide single crystal having a uniform and high nitrogen concentration may be grown.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for manufacturing silicon carbide powder comprising nitrogen, the method comprising:
preparing a mixture by mixing a silicon source including a silicon with a carbon source including a solid carbon source or an organic carbon compound;
preparing a silicon carbide powder by heating the mixture;
cooling the silicon carbide powder; and
supplying a nitrogen-based gas into the silicon carbide powder, whereby silicon carbide powder comprising nitrogen is produced;
wherein the nitrogen-based gas is supplied at a temperature lower than that of the silicon carbide powder prior to cooling,
wherein the temperature at which the nitrogen-based gas is supplied is in a range of 1400° C. to 1800° C.,
wherein the nitrogen-based gas is supplied at a rate in a range of 20 L/min to 100 L/min,
wherein a molar ratio of carbon included in the carbon source to silicon included in the silicon source is in a range of 1:1.8 to 1:2.7,
wherein the silicon carbide powder has a β type,
wherein the silicon carbide powder comprising nitrogen has a concentration of nitrogen in a range of 100 ppm to 5000 ppm,
wherein the carbon source and the silicon source are mixed with each other through a wet mixing process using a solvent,
wherein heating the mixture comprises a carbonization process and a synthesis process,
wherein a grain growing process is performed after the synthesis process,
wherein the carbonization process is performed at a temperature of 850° C. for five hours while raising the temperature at a rate of 3° C./min,
wherein the synthesis process is performed at a temperature of 1700° C. for three hours while raising the temperature at a rate of 5° C./min, and
wherein the grain growing process is performed at a temperature of 2100° C. for one hour while raising the temperature at a rate of 5° C./min.

2. The method of claim 1, wherein the nitrogen-based gas includes a nitrogen ($N_2$) gas or an ammonia ($NH_3$) gas.

3. The method of claim 1, wherein the silicon source includes at least one selected from the group consisting of silica sol, silicon dioxide, fine silica, and quartz powder; the solid carbon source includes at least one selected from the group consisting of a carbon black, a carbon nano tube, and fullerene; and the organic carbon compound includes at least one selected from the group consisting of phenol resin, franc resin, xylene resin, polyimide, polyurethane, polyacrylonitrile, polyvinyl alcohol, cellulose, sugar, pitch, tar, and saccharide.

4. The method of claim 1, wherein the silicon source and the carbon source are mixed by using a ball mill or an attrition mill to recover a mixture powder.

5. The method of claim 4, wherein the mixture powder is recovered by filtering the mixture through a sieve.

* * * * *